US 9,274,198 B2

United States Patent
Menini et al.

(10) Patent No.: US 9,274,198 B2
(45) Date of Patent: Mar. 1, 2016

(54) METHOD OF RECONSTRUCTING A SIGNAL IN MEDICAL IMAGING ON THE BASIS OF PERTURBED EXPERIMENTAL MEASUREMENTS, AND MEDICAL IMAGING DEVICE IMPLEMENTING THIS METHOD

(71) Applicants: Anne Menini, Nancy (FR); Jacques Felblinger, Mereville (FR); Freddy Odille, Laxou (FR); Pierre-Andre Vuissoz, Villers les Nancy (FR)

(72) Inventors: Anne Menini, Nancy (FR); Jacques Felblinger, Mereville (FR); Freddy Odille, Laxou (FR); Pierre-Andre Vuissoz, Villers les Nancy (FR)

(73) Assignees: UNIVERSITE DE LORRAINE, Nancy (FR); CENTRE HOSPITALIER REGIONAL DE NANCY, Nancy (FR)

( * ) Notice: Subject to any disclaimer, the term of this patent is extended or adjusted under 35 U.S.C. 154(b) by 0 days.

(21) Appl. No.: 14/364,209

(22) PCT Filed: Dec. 11, 2012

(86) PCT No.: PCT/FR2012/052868
§ 371 (c)(1),
(2) Date: Jun. 10, 2014

(87) PCT Pub. No.: WO2013/088050
PCT Pub. Date: Jun. 20, 2013

(65) Prior Publication Data
US 2014/0355844 A1    Dec. 4, 2014

(30) Foreign Application Priority Data

Dec. 12, 2011 (FR) ...................................... 11 61486

(51) Int. Cl.
*G06K 9/00*     (2006.01)
*G01R 33/565*   (2006.01)
*G06T 11/00*    (2006.01)
*G01R 33/56*    (2006.01)
*G06T 7/20*     (2006.01)

(52) U.S. Cl.
CPC ...... *G01R 33/56509* (2013.01); *G01R 33/5608* (2013.01); *G06T 7/20* (2013.01); *G06T 11/006* (2013.01); *G06T 2207/10081* (2013.01); *G06T 2207/10088* (2013.01); *G06T 2207/10104* (2013.01); *G06T 2207/10108* (2013.01); *G06T 2211/424* (2013.01)

(58) Field of Classification Search
None
See application file for complete search history.

(56) References Cited

U.S. PATENT DOCUMENTS

2011/0022375 A1   1/2011   Odille et al.

OTHER PUBLICATIONS

Atalar, et al. "A respiratory Motion Artifact Reduction Method in Magnetic Resonance Imaging of the Chest", IEEE, pp. 11-24, 1991.*

(Continued)

*Primary Examiner* — Daniel Mariam
(74) *Attorney, Agent, or Firm* — Greer, Burns & Crain, Ltd.

(57) ABSTRACT

A method is provided of reconstructing imaging signals in a biological medium on the basis of experimental measurements perturbed by movements, implementing measurements representative of the movements, at least one model of movement including movement parameters, and an imaging sampling grid, which method furthermore includes steps of (i) constructing a movement sampling grid by selecting a restricted set of points on the basis of the imaging sampling grid, and (ii) calculation of movement parameters by inverting a linear system at the points of the movement sampling grid. Devices implementing the method are also disclosed.

20 Claims, 3 Drawing Sheets

(56) References Cited

OTHER PUBLICATIONS

Meijering E. et al, "A Fast Technique for Motion Correction in DAS Using a Feature-Based, Irregular Grid," Medical Image Computing and Computer-Assisted Interventation—MICCAI '98, Oct. 13, 1998, pp. 590-597.

Odille F. et al, "Generalized Reconstruction by Inversion of Coupled Systems (GRICS) Applied to Free-Breathing MRI," Magnetic Resonance in Medicine, vol. 60, 2008, pp. 146-157, Academic Press, Duluth, MN, US.

French Search Report from French application FR 1161486; dated Jun. 18, 2012.

International Search report from corresponding application PCT/FR2012/052868; dated Mar. 12, 2013.

\* cited by examiner

METHOD OF RECONSTRUCTING A SIGNAL IN MEDICAL IMAGING ON THE BASIS OF PERTURBED EXPERIMENTAL MEASUREMENTS, AND MEDICAL IMAGING DEVICE IMPLEMENTING THIS METHOD

TECHNICAL FIELD

The present invention relates to a method for reconstructing a medical imaging signal on the basis of experimental measurements perturbed by movements of the subject or other sources of perturbation. It also relates to a medical imaging device implementing the method.

The field of the invention is more particularly but non-limitatively that of medical imaging and the imaging of biological media.

BACKGROUND

There are a number of imaging techniques that make it possible to obtain information with two-dimensional (2D) and/or three-dimensional (3D) representations of the interior of a biological organism. This information can be representative of structures and/or biological functions of this organism.

These imaging techniques are non-limitatively grouped together under the name of medical imaging techniques. The biological organism imaged, living or dead, human or non-human, is non-limitatively called the subject.

Certain techniques, such as for example nuclear magnetic resonance imaging (MRI), computed X-ray tomography scanning and positron emission tomography (PET), require sequential acquisitions of data sometimes over long periods of time. The images are then reconstructed by calculation on the basis of these data.

The reconstruction of the images can be significantly degraded by the subject's movements during acquisition, insofar as the structures imaged become deformed over time. This problem is encountered for example during acquisitions of MRI images in the region of the heart or thorax, in particular because of heartbeats and respiratory movements.

It is known to measure these physiological movements during the acquisitions, by means of additional sensors (electrocardiograms, accelerometers, pneumatic belts, etc.) and/or specific acquisition sequences of the imaging system (echo-navigators, partial MRI imaging images) in order to take them into account in the imaging data acquisition and/or processing processes.

According to certain known techniques, the measurements of physiological movements are used to synchronize the acquisitions with these movements. These techniques are however limited to the processing of periodic movements (heartbeats) within fairly restrictive limits.

According to other known techniques, the measurements of perturbations (movements, etc.) are used to generate models of deformations incorporated in the calculation of the images.

In particular, document WO 2009/098371 is known, which describes a method for reconstructing a signal or an image in a medical imaging device on the basis of perturbed measurements.

This method describes the use of a model of the perturbations, such as for example a parametric model describing the elastic physiological movements on the basis of experimental data originating from movement sensors, which is constructed so as to include the perturbations in the problem of reconstruction of the signal. The parametric model describing the perturbations is coupled with a parametric model simulating the signal without perturbation to be reconstructed. These two models are jointly optimized in an iterative process.

A method as described in WO 2009/098371 requires the resolution of linear systems, one of which models the movements, by means of iterative optimization algorithms.

When a linear equation is solved, two problems can be posed:

The large number of unknowns, leading to optimization convergence difficulties;

The use of an explicit regularization, which can distort the convergence of the algorithm.

The number of unknowns can be particularly high in a parametric model describing the perturbations or movements. It is necessary to evaluate the different components of the displacement due to each independent physiological movement, for each voxel. The number of unknowns in the linear system is therefore for example the following: size of the image×number of degrees of freedom of movement×number of physiological sensors. For example, for an image of size 256×256, with 2 directions of displacement (X and Y) and for 4 physiological movements (thoracic and abdominal respiration and their derivatives), the algorithm must find approximately 500,000 unknowns. If it is now desired to carry out the same processing on 3D data, for a volume of size 256×256×64, with 3 directions of displacement (X, Y and Z) and for 4 physiological movements, the algorithm must find more than 50 million unknowns.

With a linear optimization algorithm, the greater the number of unknowns, the more difficult the convergence of the optimization (long calculation times, convergence towards local minima, numerical instability and inaccuracy of the solution, etc.). The problem so arises for 2D reconstructions with a fine spatial resolution or also with a description of the physiological movement with numerous components. The problem also arises very rapidly for 3D reconstructions.

The problem in general comprises more independent unknowns than independent input data. It can be more or less ill-posed within the meaning of Hadamard's definition. When a problem is ill-posed, it may have several solutions. Some can sometimes even be erroneous.

In order to facilitate the convergence of a linear optimization algorithm, the principle of regularization is often used. This consists of applying an additional constraint to the solution of a problem in order to limit the number of solutions to those that are realistic. For example, a regularization can consist of limiting the displacements solely to those that are relatively smooth or regular (for example by applying constraints to the gradients of a displacement field).

Thus, when an explicit regularization is used, the solution of the linear system is that which both corresponds to the linear equation, and complies with the constraint of explicit regularization.

The constraint used to regularize the optimization of the movement models consists of limiting the displacements solely to those that are relatively smooth or regular (by applying constraints to the gradients of the displacement field). But if this constraint is actually verified within a tissue, this is not necessarily the case at the interface between the organs. These can for example slide against each other. Locally, the movement model then no longer verifies the regularization constraint.

In other words, with the explicit regularization method as found in the prior art, the compromise that must be made between the convergence capacity and the accuracy of the solution is highly detrimental.

An object of the present invention is to propose a method for modelling physiological movements that can be utilized in the context of medical imaging data processing and solves the problems mentioned, in particular concerning the number of unknowns and convergence.

Another object of the present invention is to propose a method for processing medical imaging data, in particular MRI, capable of taking the patient's movements into account.

Another object of the present invention is to propose a method for processing medical imaging data, in particular MRI, which can be implemented in the context of 3D imaging.

SUMMARY

This objective is achieved with a method for reconstructing imaging signals in a biological medium on the basis of experimental measurements perturbed by movements, implementing measurements representative of said movements, at least one movement model comprising movement parameters capable of describing movements and/or deformations of the biological medium on the basis of said measurements representative of movements, and an imaging sampling grid, characterized in that it also comprises steps of:
constructing a movement sampling grid by selecting a limited set of points from the imaging sampling grid, and calculating movement parameters by inversion of a linear system at the points of said movement sampling grid.

The method according to the invention can also comprise a step of reconstructing imaging signals in order to constitute at least one image of the biological medium according to said imaging sampling grid taking said movement parameters into account.

The points selected for constructing the movement sampling grid can in particular comprise points of the imaging sampling grid, and/or points chosen in an area covered by the imaging sampling grid.

The points selected for constructing the movement sampling grid can be chosen as a function of at least one of the following criteria: (i) their proximity to areas of interfaces between structures or organs in the biological medium and (ii) their proximity to areas of the biological medium affected by comparatively greater variations in movements and/or local deformations.

The construction of the movement sampling grid can also comprise steps of:
classifying the points of the sampling grid of an image of the biological medium obtained beforehand according to a proximity criterion representative of their proximity to areas of interfaces between structures or organs in the biological medium, so as to constitute a list thereof,
defining security areas around the points of the imaging sampling grid, the extent of which is an inverse function of the variation in the movement calculated with the movement model, and
constituting the movement sampling grid by going through the list of the points classified, starting from the points closest to the areas of interfaces between structures or organs in the biological medium and retaining, for the construction of the movement sampling grid, only the points for which no point already belonging to the movement sampling grid is located in their security area.

The security areas can be in particular rectangular, circular or elliptical.

They can be defined in such a way that their extent along the axes of the sampling grid is an inverse function of the variation in movement calculated with the movement model along said axes.

The movement sampling grid can comprise points originating from the list of classified points, and/or the points situated in proximity to points on the list of classified points.

According to embodiments,
the value of the proximity criterion can be substantially proportional to the norm of the gradient of the image at the point considered;
the extent of the security area along the axes of the grid can be an inverse function of the gradient of the movement along said respective axes.

The method according to the invention can also comprise a step of determining the movement parameters at the points of the imaging sampling grid by interpolating the calculated values at the points of the movement sampling grid.

It can also comprise a step of calculating an interpolation matrix forming the link between the parameters of the movement model and the points of the movement sampling grid and the points of the imaging sampling grid, said interpolation matrix calculation comprising steps of:
producing a Delaunay triangulation between the points of the movement sampling grid, such that the points of the imaging sampling grid not belonging to the movement sampling grid are included in a simile triangle in the case of a 2D image, or a single tetrahedron in the case of a 3D image respectively, the apexes of which are points of the movement sampling grid,
calculating, for each point of the imaging sampling grid considered, barycentric weighting coefficients in relation to the apexes of the triangle or tetrahedron including said point, defining the position of said point in relation to said apexes.

According to embodiments, the method according to the invention can implement measurements representative of a plurality of physiological movements, and a plurality of movement models associated with said physiological movements, and comprise steps of constructing a plurality of movement sampling grids for the different physiological movements, and calculating respective movement parameters according to said grids.

According to embodiments,
the reconstruction of the imaging signals can comprise a step of inversion of a linear system describing a relationship between the experimental measurements and the images, and taking into account movement parameters determined beforehand at the points of the imaging sampling grid;
the calculation of movement parameters at the points of the movement sampling grid can comprise a step of inversion of a linear system describing a relationship between, on the one hand, an error between experimental measurements and measurements estimated from reconstructed imaging signals and, on the other hand, errors in the movement parameters calculated beforehand;
the inversion of the linear system describing a relationship between the measurement errors and the movement parameter errors can be carried out without explicit regularization.

The method according to the invention can also comprise an iterative repetition of the steps of reconstructing the imaging signals and calculating movement parameters.

The method according to the invention can also comprise an iterative repetition of the steps of reconstructing the imaging signals and calculating movement parameters, for imaging sampling grids with increasing spatial resolutions.

According to embodiments, the method according to the invention can be applied to:

the reconstruction of imaging signals in a form chosen from a voxel, an image, a series of images, an MRI volume, and a series of MRI volumes;

the reconstruction of imaging signals in the form of at least one spectrum of at least one NMR spectroscopy voxel;

the reconstruction of imaging signals in a form chosen from a voxel, an image, a series of images, a volume and a series of volumes, originating from at least one medical image acquisition process among MRI, X-ray tomography, Positon Emission Tomography, single photon emission computed tomography and echography.

According to another aspect, a medical imaging device is proposed implementing the method for reconstructing imaging signals according to the invention.

The following are also proposed:
a device comprising MRI imaging means implementing the method according to the invention;
a device comprising NMR spectroscopic imaging means and implementing the method according to the invention.

An advantageous aspect of the invention consists of a modification of the local quality of the description of the displacement fields of the biological medium, via the movement and/or deformation models. Passing from a homogeneous structure (a displacement map with a description in each pixel/voxel) to a heterogeneous structure (an irregular grid of carefully chosen points) makes it possible to considerably reduce the number of unknowns in the problem.

By nature, certain areas of the displacement models are smooth. For example, two adjacent tissue elements will have a highly correlated movement if they belong to the same structure. On the other hand, two tissue elements corresponding to the interface between two structures can have independent displacements. The idea is therefore to use few points to describe the areas where the movement is highly correlated and more points where the movement is complex. An irregular movement sampling grid is thus constituted. In this way, each part of the object is placed under the most favourable conditions for evaluating the displacement by an optimization method.

It is thus sufficient to calculate the movement model based solely on the points on the irregular movement sampling grid. The displacement model can then be relocated at any point using an interpolation. In this way, it is possible to drastically reduce the number of unknowns in the problem without however reducing the quality of the description of the movement model.

It is also possible to consider the method according to the invention as a means of implicit regularization. In fact, no direct constraint is applied to the solution sought. The constraint is applied indirectly by the irregular grid: only the areas with a low density of points result in local smoothing of the displacement field. The possible number of solutions has therefore been reduced.

But above all, the dimension, i.e. the number of unknowns, of the solution sought is reduced. The numerical stability of the convergence is therefore greatly improved.

An important aspect is the selection of the points that will constitute the movement sampling grid. It has been seen that, so as not to lose information, the distribution of the points must be suited to both the anatomy (more points at the interface between structures) and the physiology (more points where the movement is complex). Insofar as the problem is part of an iterative reconstruction process, it is possible to rely on preliminary estimations of the reconstructed image and the movement model to determine the best possible grid: a grid suited to the anatomy and the physiology.

An advantage of the invention is the provision of adaptive regularization. In this way, there is no risk of adopting a regularization that is too restrictive and risks compromising the accuracy of the solution and at the same time, the regularization greatly reduces the range of solutions for improving the convergence of the optimization.

Moreover, the method according to the invention makes it possible to determine the best grid analytically, i.e. directly. It does not therefore add to the calculations.

The advantages of the invention can be illustrated via an analogy with basis reductions in linear algebra:

As the number of unknowns is reduced, the numerical stability of the optimization is improved. With the irregular grid, the method according to the invention can appear to be equivalent to a means of finding a free family in which the solution to the problem is sought rather than searching for it in a connected family;

As the regularization is suited to the problem, there is no risk of constraining the solution too much. The convergence will not therefore be distorted. The method according to the invention can appear to be equivalent to a method according to which the retention of a vector-generating family in which the solution to the problem is sought, is ensured;

As the method of regularization is adaptive, the possible number of solutions is reduced and the convergence is therefore accelerated. The method according to the invention can appear to be equivalent to a method making it possible to restrict the research vector space to that of the physiological movements of the patient rather than to any displacement field;

An explicit regularization involves the choice of a parameter referred to as a parameter $\mu$ of regularization. This choice is generally problematic as it is subjective (determined empirically) and not optimal, as it results from an overall compromise between the smoothing imposed in certain tissues and the precision of the displacement. The proposed method provides an objective (automatic and adaptive) rule for determining the optimum positioning of the nodes of the grid, so as to produce "intelligent" smoothing depending on the position of the image and the displacement field considered.

BRIEF DESCRIPTION OF THE DRAWINGS

Other advantages and features of the invention will become apparent on reading the detailed description of implementations and embodiments which are in no way limitative, and the following attached drawings.

DETAILED DESCRIPTION

Figure 1:
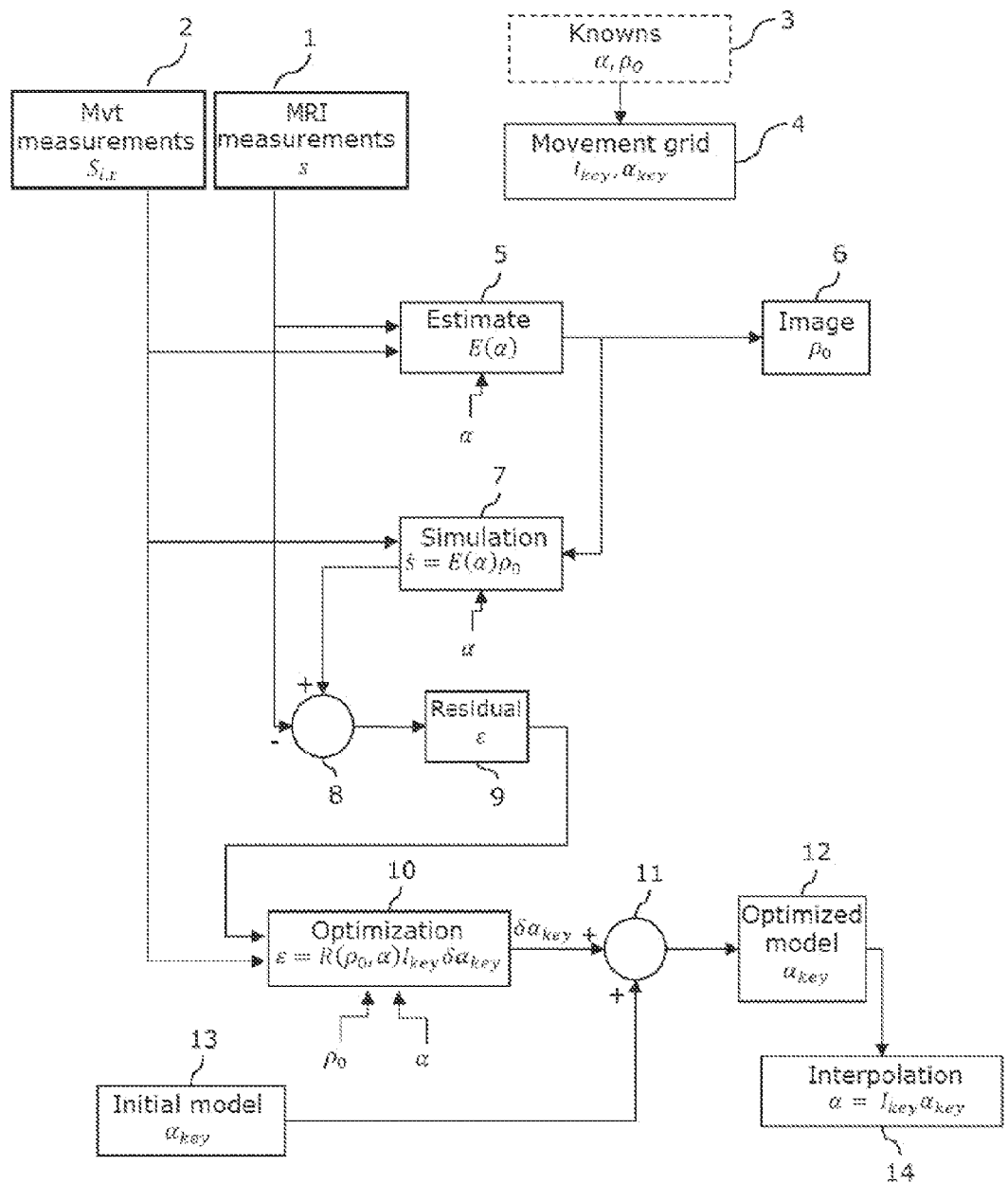
FIG. 1 shows an embodiment of the method according to the invention.

With reference to FIG. 1, an embodiment of the method according to the invention for reconstructing MRI imaging signals 6, on the basis of experimental measurements 1 obtained with a Magnetic Resonance Imaging (MRI) system is described.

This embodiment is derived from the method for reconstructing MRI imaging signals as described in document WO 2009/098371.

The input data comprise experimental measurements 1, denoted s, acquired by the MRI system on a subject. The subject can be for example a human patient. These measurements 1 can be carried out in particular in the cardiac or thoracic region, according to MRI sequences chosen by the practitioner depending on the information sought.

These experimental measurements s are perturbed by the patient's movements, due for example to respiration and/or heartbeats.

An objective of the method according to the invention is to reconstruct an MRI image 6, denoted $\rho_0$, which corresponds for example to an average physiological position of the patient.

The term "image" denotes a collection of MRI imaging signals located spatially, for example according to two-dimensional (2D) or three-dimensional (3D) sampling grids or matrices.

In order to allow the reconstruction of the MRI image $\rho_0$ on the basis of the experimental measurements s acquired by MRI, a simulation model 7 of the acquisition chain is defined, such that:

$$s = E\rho_0. \tag{Eq. 1}$$

The simulation model of the acquisition chain is thus produced in the form of a linear simulation operator E that links an image $\rho_0$ of dimensions $N_x \times N_y \times N_z$ (the numbers of voxels in the 3 spatial dimensions) to simulated experimental data s of dimensions $N_x \times N_y \times N_z \times N_\gamma \times N_R \times N_{NEX}$, $N_\gamma$ being the number of antennae, $N_R$ the parallel MRI reduction factor, and $N_{NEX}$ the number of excitations of the experimental acquisition.

The typical sizes that can be expected for the dimensions of the linear operator E are: $N_x \times N_y \times N_z = 256 \times 256 \times 32$, $N_\gamma = 8$, $N_R = 1$ and $N_{NEX} = 4$.

The simulation operator E can be broken down, as described in WO 2009/098371, into one or more sub-components each of which simulate the MRI acquisition 1 in a group of physiological positions that are sufficiently close not to perturb the MRI acquisition. Typically the number of sub-components used to carry out the method according to the invention is eight. The sub-components are indexed by a discrete index t ($t=t_1, t_2, \ldots t_N$) that represents the fictitious time of acquisition of a group of physiological positions that are sufficiently close.

The fictitious time t does not in general represent a specific time produced in real mode but rather an index of physiological position considered in the simulation. The fact that a quantification of the data is introduced gives rise to a grouping together of the data acquired at different times into packets indexed by said "index of physiological position considered" or "virtual time".

The sub-components of the simulation operator E comprise:
- a spatial transformation operator $T_t$ at an index t, which is an interpolation operator representing the displacement from $t_0$ to t. The operator $T_t$ is preferably chosen as an arbitrary spatial transformation, allowing locally free deformations to be taken into account;
- an antenna sensitivity weighting operator $\sigma_\gamma$ for the corresponding antenna $\gamma$ ($\gamma = 1 \ldots N_\gamma$);
- a Fourier transform operator F in three dimensions; and
- a sampling operator $\xi_t$ an index t.

The simulation operator E is then written by stacking the acquisitions of the different antennae as follows:

$$E = \begin{bmatrix} \xi_{t_1} F \sigma_1 T_{t_1} \\ \vdots \\ \xi_{t_N} F \sigma_1 T_{t_N} \\ \vdots \\ \xi_{t_1} F \sigma_{N_\gamma} T_{t_1} \\ \vdots \\ \xi_{t_N} F \sigma_{N_\gamma} T_{t_N} \end{bmatrix} \tag{Eq. 2}$$

The spatial transform operators $T_t$ are determined on the basis of models of perturbation by movement, or movement models.

The movements are modelled on the basis of measurements representative of physiological movements 2 carried out during the MI acquisitions 1.

The movement measurements 2 can be obtained by different means, depending on the applications. The following can be mentioned in particular:
- measurements originating from the MRI acquisitions, such as navigator echoes;
- measurements originating from external sensors, such as for example respiratory belts and electrocardiogram electrodes, or signals derived therefrom.

Preferably, as many movement models or partial movement models are constructed as there are recorded physiological movements. For example, by arranging two respiratory belts on the patient, information can be obtained corresponding to the thoracic respiration movement and the abdominal respiration movement respectively, making it possible to produce two movement models.

The parameter or set of parameters making it possible to describe a movement model of index i is denoted $\alpha_i$ and the measurements of physiological movements 2 for the movement model of index i at time t are denoted $S_{i,t}$.

The effect of the movement perturbation models can be described by an elastic displacement field $U_t$. This displacement field, representative of an overall movement model, is the linear combination of the N models of physiological movements configured by the parameters $\alpha = \{\alpha_i\}_{i \in [1,N]}$. The weighting is given by the N associated physiological signals $S_{i,t}$ measured at time t:

$$U_t = \sum_{i=1}^{N} \alpha_i S_{i,t} \tag{Eq. 3}$$

Thus, for each (fictitious) acquisition time t, the image $\rho_0$ can be deformed into the image $\rho_t$—corresponding to the physiological position at time t—using the elastic displacement field $U_t$. For the sake of clarity, the overall movement model bringing together all the movement models is simply called "the movement model".

An important step in the process of reconstructing the imaging signals therefore consists of modelling the acquisition chain. For this, it is necessary to model the physiological movements by determining their parameters $\alpha = \{\alpha_i\}_{i \in [1,N]}$. In this way, it is then possible to correct the displacements U arising during the acquisition.

The term "adaptive reconstruction" is therefore used, as the image reconstruction process uses a model that adapts to the real image acquisition chain, taking into account the information on the movements:

$$E = E(\alpha). \tag{Eq. 5}$$

The estimation 5 of the image $\rho_0$ is carried out by solving the inverse problem of the equation (Eq. 1), more particularly by using the formulation of the Hermitian symmetry problem, which is written as follows:

$$E^H s = E^H E \rho_0, \tag{Eq. 6}$$

With $$E^H E = \sum_{n=1}^{N} T_{t_n}^H (\sum_{\gamma=1}^{N_\gamma} \sigma_\gamma^H F^H \xi_{t_n}^H \xi_{t_m} F \sigma_\gamma) T_{t_m}. \tag{Eq. 7}$$

The equation (Eq. 6) is solved using an iterative algorithm that does not require explicit knowledge of the operator $E^H E$ such as the conjugate gradient method or the generalized minimal residual method (GMRES). Such algorithms only require knowledge of the function $x \mapsto E^H E x$, which can be calculated by applying the different operators in the sum of the equation (Eq. 7) in sequence. This makes it possible to limit the demand for RAM in the implementation and allows the use of the rapid Fourier-transform algorithm. The conditioning of the operator $E^H E$ can be increased by increasing the number of independent acquisitions $N_{NEX}$. A Tikhonov regularization is used for solving the inverse problem, the operator $E^H E$ being replaced by $E^H E + \lambda Id$, Id being the identity matrix. A typical value for $\lambda$ is $\lambda=0.01$. The estimation of the image $\rho_0$ can thus be calculated by means of the following formula:

$$\rho_0 = \min_{\rho_0}\{\|s - E(\alpha)\rho_0\|^2 + \lambda\|\rho_0\|^2\}. \qquad (Eq.\ 8)$$

As the result of the reconstruction depends on the quality of the modelling of the movement parameters $\alpha$, it can be assumed that a linear relationship exists at least for small variations between the imaging data reconstruction error and the movement modelling error $\delta\alpha$.

An estimation of the reconstruction error is obtained by calculating simulated experimental data $\hat{s}$ on the basis of the image $\rho_0$ with the simulation model 7 of the acquisition chain. The reconstruction error is approximated by the residual 9, denoted $\epsilon$, which corresponds to the difference 8 between the simulated data $\hat{s}$ and the experimental data s, $$\epsilon = s - \hat{s} = s - E\rho_0 = R\delta\alpha \qquad (Eq.\ 9)$$

The residual operator R is introduced in order to define the linear relationship between small variations in the parameters of the movement perturbation model $\delta\alpha$ and the residual $\epsilon$, i.e., $$\epsilon = R\delta\alpha. \qquad (Eq.\ 10)$$

According to a development detailed in WO 2009/098371, the residual operator $R(\rho_0, \alpha)$ can be written as a function of the operators included in the simulation operator $E(\alpha)$, to which is added a composition of the spatial gradient of the imaging signal estimated at the time considered $(-\nabla\hat{\rho}_t)^T$ and information correlated with the movement $S_{i,t}$:

$$\varepsilon = R(\rho_0, \alpha)\delta\alpha \qquad (Eq.\ 11)$$

$$= \begin{bmatrix} \xi_{t_1} F\sigma_1(-\nabla\hat{\rho}_{t_1})^T \sum_{i=1}^{N} S_{i,t_1}\delta\alpha_i \\ \vdots \\ \xi_{t_N} F\sigma_1(-\nabla\hat{\rho}_{t_N})^T \sum_{i=1}^{N} S_{i,t_N}\delta\alpha_i \\ \vdots \\ \xi_{t_1} F\sigma_{N_y}(-\nabla\hat{\rho}_{t_1})^T \sum_{i=1}^{N} S_{i,t_1}\delta\alpha_i \\ \vdots \\ \xi_{t_N} F\sigma_{N_y}(-\nabla\hat{\rho}_{t_N})^T \sum_{i=1}^{N} S_{i,t_N}\delta\alpha_i \end{bmatrix}$$

The solution of the inverse problem of the residual operator R, taking as is input the residual $\epsilon$ and providing the errors $\delta\alpha$ as output, makes it possible to carry out an optimization 10 of the parameters of the perturbation model $\alpha$. For this, a combination 11 (in the form of an addition) of the errors $\delta\alpha$ calculated with the parameters of the initial perturbation model 13, i.e. the model used in the previous steps, is carried out and an optimized perturbation model 12 that can be used during subsequent iterations is thus obtained.

As for the inverse problem of the simulation 7, the solution of the inverse problem of the residual operator R is carried out by solving the equivalent Hermitian symmetry problem using the GMRES iterative method.

The solution of the inverse problem of the residual operator R using an explicit regularization as described in WO 2009/098371, poses a certain number of problems:

the very large number of unknowns can give rise to difficulties of convergence of the optimization, and problems of calculation time;

the use of an explicit regularization can distort the convergence of the algorithm.

Figure 2:
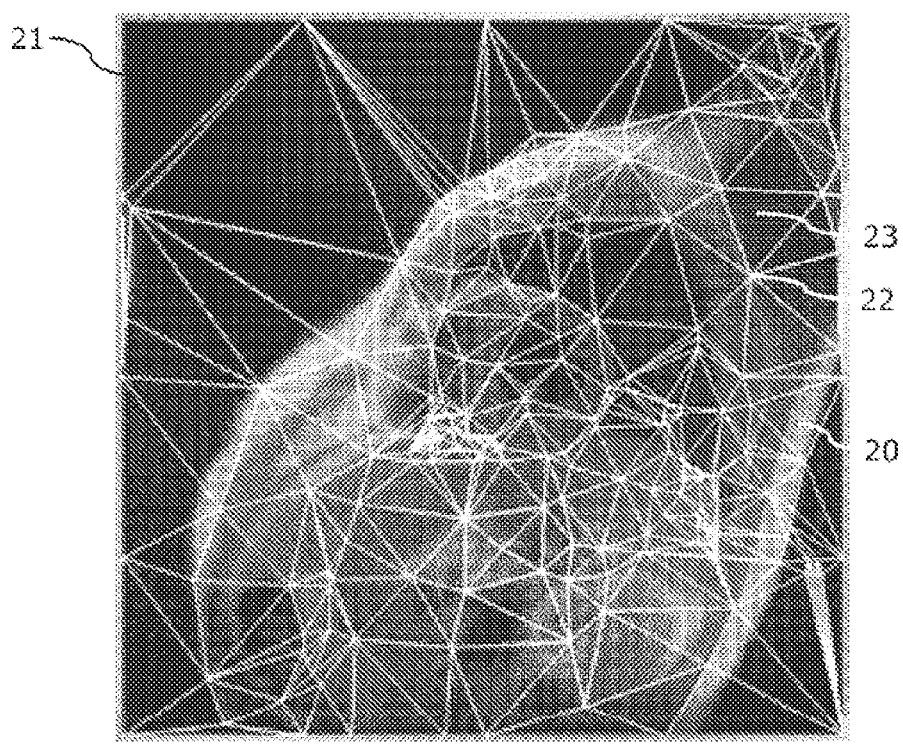
FIG. 2 shows a movement sampling grid according to the invention, on a thoracic MRI image.

With reference to FIG. 2, according to the invention, the solution of the inverse problem of the residual operator R is carried out solely on a sub-set of points of the imaging sampling grid 21 on which the imaging signals 20 are reconstituted. This sub-set of points constitutes the movement sampling grid 22. This grid is adapted to the structure of the organs and the nature of the patient's movements.

In fact, it has been seen that by nature, certain areas of the displacement models are smooth. For example, two adjacent tissue elements will have a highly correlated movement if they belong to the same structure. On the other hand, two tissue elements corresponding to the interface between two structures can have independent displacements. The idea is therefore to use few points to describe the areas where the movement is highly correlated and more points where the movement is complex. An irregular grid of points 22 is thus constituted. In this way, each part of the object is placed under the most favourable conditions for evaluating the displacement by an optimization method.

Thus, it is sufficient to calculate the parameters $\alpha_{key}$ of the movement model 12 by solving the inverse problem of the residual operator R based solely on the points of the movement sampling grid 22. Then, the displacement model can be relocated at any point on the imaging sampling grid 21 using an interpolation 14. Defining an interpolation matrix $I_{key}$, this interpolation 14 is written:

$$\alpha = I_{key}\alpha_{key}. \qquad (Eq.\ 12)$$

In this way, it is possible to drastically reduce the number of unknowns in the problem without however reducing the quality of the description of the movement model.

Moreover, this method can be considered as a means of implicit regularization. It is no longer necessary to apply direct constraints (via an explicit regularization) to the solution that is sought. The constraint is applied indirectly by the irregular grid: only the areas with a low density of points result in local smoothing of the displacement field. The possible number of solutions has therefore been reduced.

The estimation 10 of the movement modelling error Sa can then be calculated by means of the following formula:

$$\delta\alpha_{key} = \min_{\delta\alpha}\{\|\varepsilon - R(\rho_0, \alpha)I_{key}\delta\alpha_{key}\|^2\}. \qquad (Eq.\ 13)$$

It can be noted that this formula contains no explicit regularization terms.

The steps of construction 4 of the movement sampling grid 22 will now be described.

When no estimation of the image $\rho_0$ or of the movement model $\alpha$ is available, for example during a first iteration of the algorithm, the points of the movement grid or irregular grid 22 are selected at random. One of the advantages of the irregular grid 22 that is sought is the fact that the number of points at which the movement model will have to be located is lower than if the problem were solved based on the complete imaging sampling grid 21. In order to retain this property on the grid 22 selected at random, only a certain percentage of the number of available points 21 are selected. This ratio can be fixed by the user beforehand. A ratio of $1/25$ is adopted by default.

When an estimation of the image $\rho_0$ and/or of the movement model $\alpha$ is available, the following operations are carried out in order to automatically select the points of the movement grid 22:

- for the points of the imaging sampling grid 21 a map of criteria is constructed based on the image $\rho_0$. The probability of a point of the grid 21 being selected for the movement grid 22 depends on the value of this criterion;
- similarly, for the points of the imaging sampling grid 21 a map of criteria is constructed based on the movement model $\alpha$;
- the points are selected on the basis of these maps of criteria in order to constitute the movement grid 22.

It has been seen that it is better for the points of the irregular grid 22 to be situated at the interfaces between the organs. In fact, within the same tissue, the deformations are expected to evolve linearly, therefore in a manner that can be easily interpolated from few points. Furthermore, the deformations are likely to be more complex at the interfaces between two distinct tissues. More points are therefore needed to describe them. On the other hand, in an MRI image (among other things), within the same tissue the contrast of the image varies little, therefore even if a movement occurs in the tissue, it will have few consequences on the image $\rho_0$. It is therefore unnecessary to describe it precisely.

In order to detect the interfaces between the organs, a criterion based on the norm of the gradient of the image $\rho_0$ is used.

The points 21 are classified in decreasing order based on this criterion.

It is at the places where the movement is most complex, i.e. where it varies the most, that the number of points 22 selected must be the greatest. Therefore similarly, the criterion chosen is the gradient of the movement model, representative of the displacement $U_r$. The values of the gradients in the different directions of the image are calculated. For example in 2D, there are two gradients, in direction X and direction Y.

Based on this movement model gradient map, a dispersion map is constructed for each dimension of the imaging sampling grid 21 (i.e. two is maps in the case of 2D), by associating a coefficient of dispersion by dimension with each point.

The coefficients of dispersion are defined between a minimum dispersion value and a maximum dispersion value. These values can be fixed by the user beforehand. By default, the minimum dispersion is 1 pixel/voxel and the maximum dispersion is $1/5$ of the size of the image in the direction of interest.

The coefficients of dispersion are defined according to a function inversely proportional to the gradient of the movement model: the points having the smallest gradient (which therefore correspond to areas with little local deformation) are assigned a maximum coefficient of dispersion and vice versa. A dispersion is thus associated with each point as a function of its gradient, in all directions.

From the list of the points 21 classified as a function of the criterion based on the norm of the gradient of the image $\rho_0$ and the dispersion maps, the most suitable points for constructing the movement grid 22 are selected.

The procedure is as follows:

1) creating a map of the points selected (empty for the moment);
2) by means of thresholding, determining a threshold that describes the "black" background of the image $\rho_0$ (i.e. not belonging to the biological medium);
3) going through the classified list of the points as a function of the criterion based on the norm of the gradient of the image $\rho_0$. For each point that does not belong to the background of the image:

- a rectangular security area is constructed around the point, the dimensions of which are given by the dispersion maps previously calculated in the different directions. The dimensions of the security area can in particular be proportional or equal to the coefficients of dispersion at the point;
- if this security area comprises no points already selected, this point is added to the map of the selected points. Otherwise it is not added;
- these steps are repeated until the maximum number of points chosen by the user has been selected (with a default value of $1/25$ of the total number of points 21) or until the entire list has been gone through.

Thus, the selected points, which define the movement grid 22, are situated as a priority at the interfaces between the organs, and are denser where the movement is complex. In this way, the grid 22 is optimal for being able to restrict the description of the movement to these points only.

As indicated previously, the algorithm according to the invention reconstructs as many movement models $\alpha_i$ as there are recorded physiological movements $S_{i,t}$. The displacements brought about on the organs by each of these physiological movements are different. As many irregular grids 22 as there are physiological movements are therefore constructed.

This means that for i physiological movements, i movement grids are constructed, each with its interpolation matrix $I_{key,i}$, and the steps of optimization 10 and calculation of the optimized model 12 are carried out for each of these grids so as to update the parameters $\alpha_{key,i}$ on their respective grids 22.

In this case, the coupled optimization of the simulation model 5 to obtain the image $\rho_0$ and of the movement models 10 to obtain the respective parameters $\alpha_{key,i}$ is carried out by a fixed-point method, i.e. each model is optimized separately, all the others being considered fixed. This optimization is carried out alternately on the simulation model 5 then on one of the movement models 10, this optimization sequence being repeated on each of the models alternately.

The calculation of the interpolation matrix $I_{key}$, which makes it possible to determine the movement parameters $\alpha$ at all points of the imaging sampling grid 21 based on the parameters $\alpha_{key}$ calculated on the movement grid 22, comprises two steps:

- first, a Delaunay triangulation is carried out on all of the points of the movement grid 22, such that each point of the imaging sampling grid 21 (which is not at the same time a point of the movement grid 22) are included in one single triangle the apexes of which are points of the movement grid 22.
- Then, for each point P of the imaging sampling grid 21, the triangle to which it belongs is sought. The points of the movement grid 22 that are its apexes are denoted $Q_k$. The weight $w_k$ to be associated with each apex $Q_k$ is sought, such that the sum of the weight $w_k$ equals to one and the point P is the barycentre of the apexes $Q_k$ weighted with the weight $w_k$ (in 2D, this operation corresponds to the inversion of a linear system 2×2). These weights correspond to the contribution that must be attributed to each value of the movement model at the points $Q_k$ of the movement grid 22 to relocate the displacement at the point P. Therefore:

$$I_{key}(P,Q_k)=w_k \quad (Eq. 14)$$

It will be noted that the interpolation matrix $I_{key}$ is independent of the values of the movement model $\alpha_{key}$ on the grid 22. It depends solely on the position of the points of the movement grid 22. It is therefore sufficient to calculate an interpolation matrix $I_{key}$ per movement grid 22 once only.

This method of calculation of the interpolation matrix $I_{key}$ is valid in any dimension. It is in particular applicable in 3D, using tetrahedrons instead of triangles to carry out the triangulation.

With reference to FIG. 2, the method according to the invention is implemented iteratively in a multi-resolution approach.

The method according to the invention is based on the solution of two coupled linear systems 5, 10. These are iterative optimization algorithms that are used to solve these two equations alternately in the context of the fixed-point method. Generally, iterative optimization algorithms require a good initialization of the solution. The further the initialization is from the solution, the longer the convergence and the greater the risk of converging towards a local minimum that does not correspond to the solution. Furthermore, the higher the number of unknowns in the equation, the greater these pitfalls.

The idea of the multi-resolution loops therefore consists of firstly solving the problem with low spatial resolution, i.e. with an imaging sampling grid 21 with few points and low spatial resolution. The number of unknowns is thus low and convergence is ensured, with whatever initialization. It is then possible to use the low resolution solutions that have just been obtained to initialize the problem at a higher resolution, then solve the problem once more at the new resolution. And so on as far as the native resolution level.

The method comprises two nested iterative loops: a resolution loop 31 and an optimization loop (at a given resolution) 33.

The termination condition 39 of the resolution loop is the reaching of the maximum resolution. Thus the result 40 is obtained, namely the image $\rho_0$ and the model $\alpha$.

The resolution loop comprises a step 32 of calculating the movement grid 22 and determining the interpolation matrix $I_{key}$ and the parameters of the movement models $\alpha_{key}$. The input data comprise either zero movement parameters ($\alpha=0$) during the first iteration, or the movement parameters $\alpha$ and the image $\rho_0$ obtained at the end of the iteration at the lower resolution.

Figure 3:
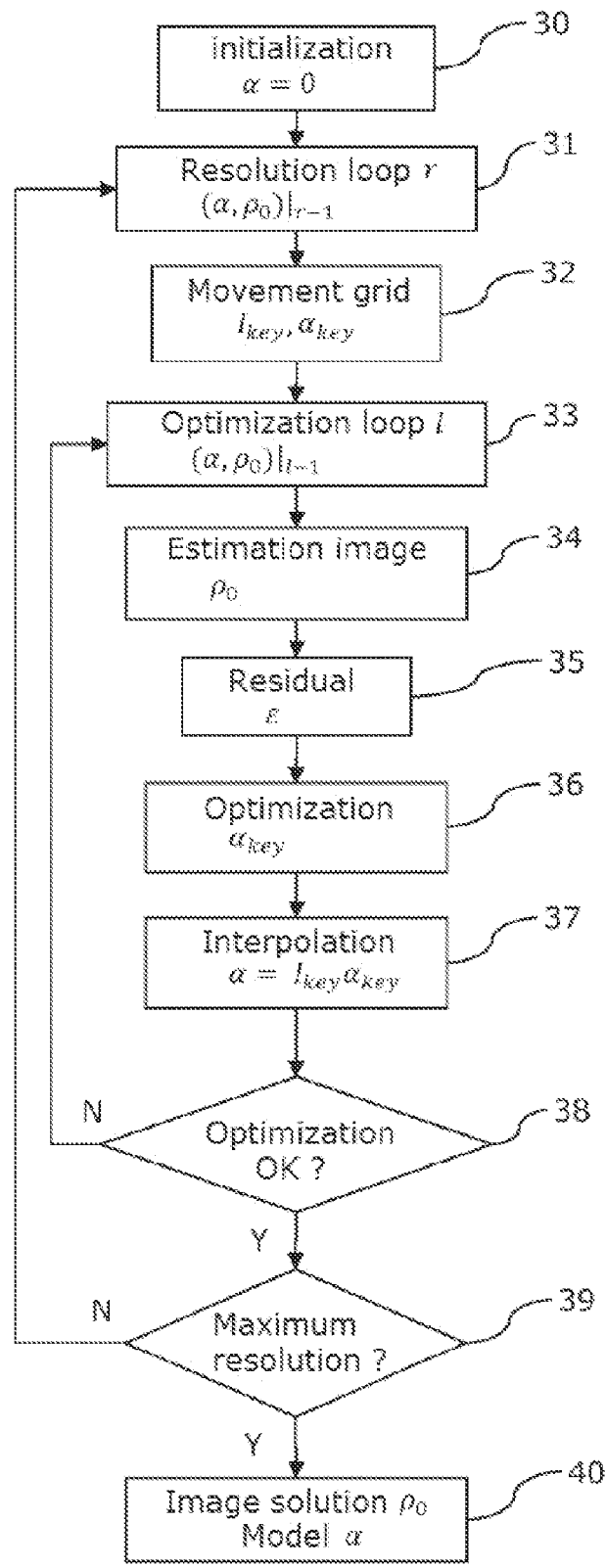
FIG. 3 shows an embodiment of the method according to the invention, in the form of mufti-resolution iterations.

The optimization loop 33 is then entered, which comprises the steps shown in detail in FIG. 3:

of estimating 34 the image $\rho_0$,
of calculating 35 the residual $\epsilon$,
of optimizing 36 the parameters of the movement model $\alpha_{key}$ on the movement grid(s) 22,
of calculating by interpolation 37 the parameters of the movement model $\alpha$ on the imaging sampling grid 21.

On each iteration of the optimization loop, the estimations of the image $\rho_0$ and of the movement parameters $\alpha$, $\alpha_{key}$ obtained during the previous iteration are used to calculate new estimations, until a termination condition 38 is reached, based on detection of a convergence towards an optimum estimation of these parameters.

According to variants:

During a first iteration where no estimation of the image $\rho_0$ or of the movement model $\alpha$ is yet available, the points of the movement grid 22 can be selected by carrying out a systematic sub-sampling of the imaging sampling grid 21;

The points of the movement grid 22 may be selected in the plane or volume covered by the imaging sampling grid 21, but at least some of them may not be included in the points of the imaging sampling grid 21;

The irregular movement sampling grid can be applied to 2D or 3D imaging. The method is particularly advantageous for 3D imaging because of the greater number of unknowns to be processed;

Only one single movement grid 22 may be used for a plurality of, or all of, the physiological movements $S_{i,t}$;

During the construction of the irregular movement sampling grid, rather than directly selecting a "candidate" point from the list of classified points 21, it is possible to determine the orientation of the contour of the image at this point and to place two points on each side of the contour, around the "candidate" point initially identified. For example, in the case of an image comprising an interface separating two parts, with the method described in the main embodiment, the points of the movement sampling grid are all aligned on this interface. In the present variant, the points of the movement sampling grid are distributed on each side of the interface, in immediate proximity to the latter. Thus, a shear movement at the level of this interface is better described;

Criteria for selecting the points can be added in order to construct the movement grid or grids 22. In particular, it may be added, as a criterion for selecting the points, that the gradient of the image $\rho_0$ at the point must also have a local maximum. This additional constraint can be necessary for example for images with few level variations (smooth images);

Other criteria can be used to construct the movement grid or grids 22, and optionally different criteria for different grids. For the criterion on the image $\rho_0$, it is possible to use shape recognition to distinguish between the organs. It is also possible to use a well-known set of data, on the basis of which an expert determines the best locations of the points beforehand, and then to use these reference grids 22 as an "atlas" to adapt them to our particular case by registration;

In a multi-resolution approach as presented in FIG. 3, the irregular grids 22 may be used only starting from a certain level of resolution, when the multi-resolution method is no longer sufficient to allow the convergence of the algorithm;

Throughout a single level of resolution, the estimation of the image $\rho_0$ and the estimation of the movement model $\alpha$ improve. It is possible to re-execute the algorithm 4 for determining the movement grids 22 each time these unknowns $\rho_0,\alpha$ are improved;

The principle of the irregular sampling grid can be applied to any element of solution to the problem. In the embodiments presented, an image and at least one movement model are reconstructed, for which the irregular grid is used. It is also possible to add the optimization of maps of antenna sensitivity or physiological signals. In this case, irregular grids can be used on these elements;

The principle of the use of the irregular grid to describe a movement model can form part of a much wider context and in particular be used in all non-rigid registration problems.

Of course the invention is not limited to the examples that have just been described and numerous adjustments can be made to these examples without exceeding the scope of the invention.

The invention claimed is:

1. A method for reconstructing imaging signals in a biological medium on the basis of experimental measurements perturbed by movements, comprising:
    implementing measurements representative of said movements; at least one movement model comprising movement parameters capable of describing movements and/or deformations of the biological medium on the basis of said measurements representative of movements and an imaging sampling grid, the points of which being used for reconstructing the imaging signal;
    constructing a movement sampling grid by selecting a limited set of points from the imaging sampling grid, the points selected for constructing the movement sampling grid being chosen using a criterion constructed as a function of the movement parameters of a preliminary estimation of the at least one movement model, so that the points of the movement sampling grid are close to areas of the biological medium affected by comparatively greater movement variations and/or local deformations; and
    calculating the movement parameters of each movement model by inversion of a linear system at the points of said movement sampling grid.

2. The method according to claim 1, in which the points selected for constructing the movement sampling grid are also chosen as a function of the following criterion: their proximity to areas of interfaces between structures or organs in the biological medium.

3. The method according to claim 2, in which the construction of the movement sampling grid also comprises steps of:
    classifying the points of the sampling grid of an image of the biological medium obtained beforehand according to a proximity criterion representative of their proximity to areas of interfaces between structures or organs in the biological medium, so as to constitute a list thereof;
    defining security areas around the points of the imaging sampling grid, the extent of which is an inverse function of the variation in the movement calculated with the movement model; and
    constituting the movement sampling grid by going through the list of the classified points, starting from the points closest to the areas of interfaces between structures or organs in the biological medium, and retaining, for the construction of the movement sampling grid only the points for which no point already belonging to the movement sampling grid is located in their security area.

4. The method according to claim 3, in which the value of the proximity criterion is based on the norm of the gradient of the image at the point considered.

5. The method according to claim 3, in which the extent of the security area along the axes of the grid is an inverse function of the gradient of the movement along said respective axes.

6. The method according to claim 1, which also comprises a step of determining the movement parameters at the points of the imaging sampling grid by interpolation of the calculated values at the points of the movement sampling grid.

7. The method according to claim 6, which also comprises a step of calculating an interpolation matrix forming the link between the parameters of each movement model at the points of the movement sampling grid and at the points of the imaging sampling grid, said interpolation matrix calculation comprising steps of:
    producing a Delaunay triangulation between the points of the movement sampling grid, such that the points of the imaging sampling grid not belonging to the movement sampling grid are included in a single triangle in the case of a 2D image, or a single tetrahedron in the case of a 3D image respectively, the apexes of which are points of the movement sampling grid; and
    calculating, for each point of the imaging sampling grid considered, barycentric weighting coefficients in relation to the apexes of the triangle or tetrahedron including said point, defining the position of said point in relation to said apexes.

8. The method according to claim 1, further including implementing measurements representative of a plurality of physiological movements, and a plurality of movement models associated with said physiological movements, and comprising steps of constructing a plurality of movement sampling grids for the different physiological movements, and calculating respective movement parameters according to said grids.

9. The method according to claim 1, in which the reconstruction of the imaging signals comprises a step of inversion of a linear system describing a relationship between the experimental measurements and the images, and taking into account movement parameters determined beforehand at the points of the imaging sampling grid.

10. The method according to claim 9, in which the calculation of the movement parameters at the points of the movement sampling grid comprises a step of inversion of a linear system describing a relationship between, on the one hand, an error between experimental measurements and measurements estimated from reconstructed imaging signals and, on the other hand, errors in the movement parameters calculated beforehand.

11. The method according to claim 10, in which the inversion of the linear system describing a relationship between the measurement errors and the errors in the movement parameters is carried out without explicit regularization.

12. The method according to claim 1, which also comprises an iterative repetition of the steps of reconstructing the imaging signals and calculating movement parameters.

13. The method according to claim 1, which also comprises an iterative repetition of the steps of reconstructing the imaging signals and calculating movement parameters, for imaging sampling grids with increasing spatial resolutions.

14. The method according to claim 1, for reconstructing imaging signals in a form chosen from a voxel, an image, a series of images, an MRI volume, and a series of MRI volumes.

15. The method according to claim 1, for reconstructing imaging signals in the form of at least one spectrum of at least one NMR spectroscopy voxel.

16. The method according to claim 1, for reconstructing imaging signals in a form chosen from a voxel, an image, a series of images, a volume and a series of volumes, originating from at least one medical image acquisition process among MRI, X-ray tomography, Positon Emission Tomography, single photon emission computed tomography and echography.

17. A device comprising medical imaging means and implementing the method for reconstructing imaging signals according to claim 1.

18. The device according to claim 17, comprising MRI imager.

19. The device according to claim 17, comprising NMR spectroscopic imager.

20. The method according to claim 1, which also comprises an iterative repetition of the step of constructing a movement sampling grid and an iterative repetition of the step of calculating the movement parameters of each movement model, wherein, for a given iteration of the step of constructing a movement sampling grid, the points selected for constructing said movement sampling grid are chosen using a criterion constructed as a function of the movement parameters of each movement model calculated in the previous iteration of the step of calculating the movement parameters of each movement model.

* * * * *